United States Patent
Sung et al.

[11] Patent Number: 5,820,682
[45] Date of Patent: Oct. 13, 1998

[54] LASER DEPOSITION APPARATUS FOR DEPOSITING A LARGE AREA OXIDE THIN FILM ON A SUBSTRATE

[75] Inventors: Gun Yong Sung; Jeong Dae Suh, both of Daejon, Rep. of Korea

[73] Assignee: Electronics and Telecommunications Research Institute, Daejon, Rep. of Korea

[21] Appl. No.: 965,765

[22] Filed: Nov. 7, 1997

[30] Foreign Application Priority Data

Nov. 7, 1996 [KR] Rep. of Korea ................. 96-52622

[51] Int. Cl.⁶ ................................................ C23C 14/00
[52] U.S. Cl. .......................................................... 118/726
[58] Field of Search ........................................... 118/726

[56] References Cited

U.S. PATENT DOCUMENTS 5,622,567  4/1997  Kojima ................................. 118/726

FOREIGN PATENT DOCUMENTS 0 469 603 A2  2/1992  European Pat. Off. .

Primary Examiner—Richard Bueker
Attorney, Agent, or Firm—Jacobson, Price, Holman & Stern, PLLC

[57] ABSTRACT

A laser deposition apparatus for a large area oxide thin film which can enable thin films of a large area to be deposited by varying a target affixing method when performing a pulse laser deposition which most effectively deposits various oxide thin films of a complex chemical composition. The apparatus in accordance with the present invention comprises a tilted target affixed to a rotatable target plate by a target frame such that the target is tilted with respect to the target plate; a substrate heater on which the substrate can be mounted and which can be rotated on its own axis; and an eximer laser installed within a vacuum chamber for irradiating a laser beam to said tilted target.

7 Claims, 1 Drawing Sheet

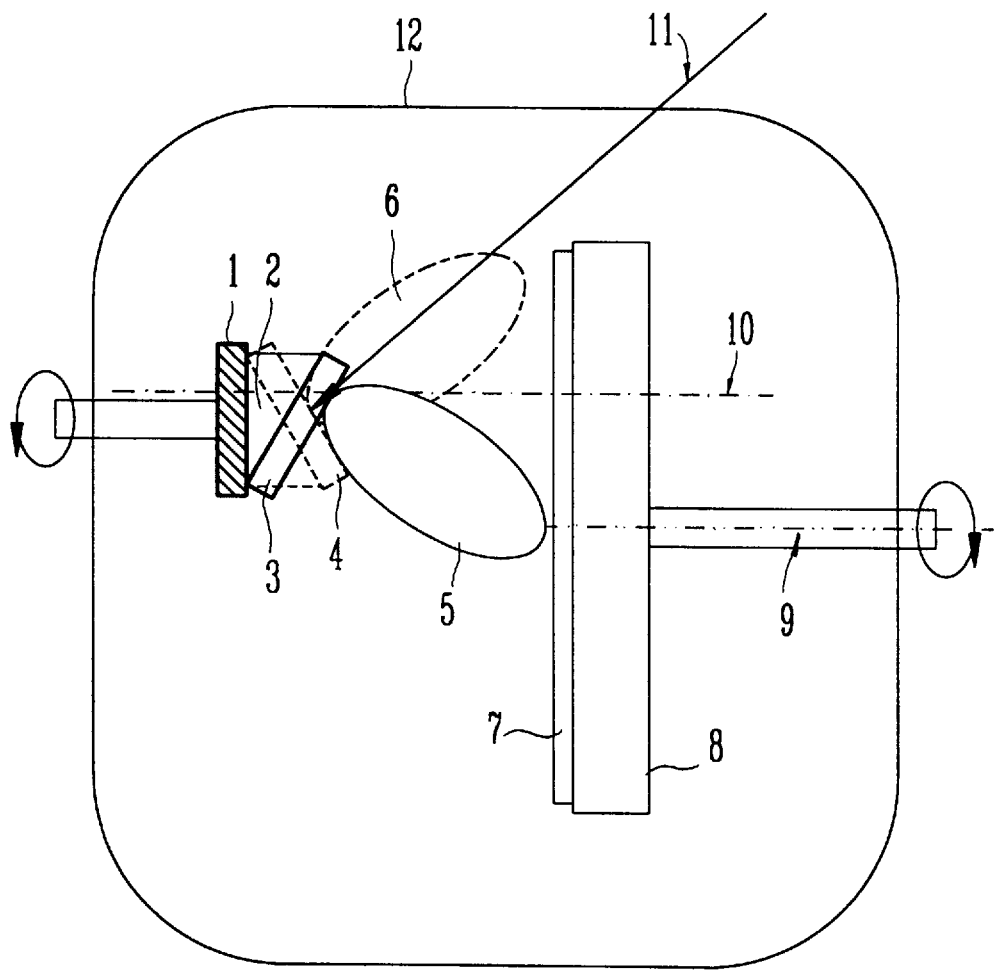

LASER DEPOSITION APPARATUS FOR DEPOSITING A LARGE AREA OXIDE THIN FILM ON A SUBSTRATE

BACKGROUND OF THE INVENTION

1. Field of the Invention

The present invention relates to a laser deposition apparatus, and more particularly, to a laser deposition apparatus which can enable thin films of a large area to be deposited by varying a target affixing method when performing a pulse laser deposition which most effectively deposits various oxide thin films of a complex chemical composition.

2. Description of the Related Art

Due to the rapid developments of information communication technologies, the performance of the various components related to this technical field is becoming increased. The materials which recently have a wide acceptance while meeting the increasing demands include perovskite oxide such as an oxide high temperature super conductive thin film, an oxide ferroelectric thin film, etc. These materials have drawbacks that they consist of more than four component atoms, making it difficult to obtain their stoichiometric compositions and that it takes a long time to get an optimum condition for growing thin films. As a result of researches on a high temperature superconductive thin film at the end of 1980, a pulse laser deposition method was developed to overcome the drawbacks as mentioned above. However, these deposition methods has a limitation that the deposition area is limited to below 2.5 cm in diameter since the size of a laser beam used as an energy source of materials to be deposited is as small as 2 mm×5 mm. As another method to overcome the above limitation, a laser beam or substrate is periodically moved to deposit a uniform oxide thin film on a substrate of a diameter of 5–15 cm. However, all the conventional methods as mentioned thus far have a disadvantage that it is difficult to economically implement the methods since it is required to install a separate optical system for moving a laser beam or an auxiliary device for moving a substrate is required.

SUMMARY OF THE INVENTION

It is therefore an object of the present invention to provide a laser deposition apparatus for a large area oxide thin film which can deposit a large area thin film without moving a laser beam or substrate.

In accordance with one aspect of the present invention, a laser deposition apparatus for depositing a large area oxide thin film on a substrate is provided which comprises a tilted target affixed to the a rotatable target plate by a target frame such that the target is tilted with respect to the target plate; a substrate heater on which the substrate can be mounted and which can be on its own axis; and an eximer laser installed within a vacuum chamber for irradiating a laser beam to said tilted target.

With the use of the laser deposition apparatus for a large area oxide thin film in accordance with the present invention, oxide thin films of a complex chemical composition can be uniformly deposited on a substrate of a diameter of 16 cm at a low cost. Particularly, when manufacturing a high frequency filter having a high temperature superconductive characteristics for use in a mobile communication, in which a large area thin film technology is important, a large area oxide thin film having a high temperature superconductive characteristic can be uniformly deposited at a low cost.

BRIEF DESCRIPTION OF THE DRAWINGS

The present invention will become more apparent upon a detailed description of the preferred embodiments for carrying out the invention as rendered below. In the description to follow, references will be made to the accompanying drawings, where like reference numerals are used to identify like or similar elements in the various drawings and in which:

FIG. 1 illustrates a laser deposition apparatus for forming a large area oxide thin film which uses a pulse laser in accordance with the present invention.

DETAILED DESCRIPTION OF THE INVENTION

FIG. 1 illustrates a laser deposition apparatus for forming a large area oxide thin film, which uses a pulse laser in accordance with the present invention. As shown in FIG. 1, the deposition apparatus comprises a rotatable tilted target 3, a substrate heater 8 on which a substrate 7 of a diameter of 16 cm can be mounted and which can be rotated on its axis 9, and an eximer laser 11 which is installed within a vacuum chamber 12 for making a laser beam incident upon the tilted target 3. The vacuum chamber 12 has a vacuum level of about $1 \times 10^{-6}$ Torr. The vacuum chamber 12 should be connected to a gas supply system (not shown) which can supply oxygen or argon. The target 3 is formed of a cylinder shape having a diameter of 2.5 cm and composed of a polycrystalline sintered-body as same as an oxide thin film to be deposited. The target 3 is affixed to a target plate 1 by using a target frame 2 such that it is tilted 45° with respect to the target plate 1. The distance between the axis of rotation 9 of the substrate and the axis of rotation 10 of a plume is a little shorter than the distance between the target 3 and the substrate 7. As mentioned before, the plume 5 generated by the laser beam rotates by 360° along the axis of rotation 10 of the plume as the target 3 rotates, when the laser deposition apparatus is used. At the time when the target 3 rotates by 180°, the position of the target is indicated by reference numeral 4, and the plume emitted is indicated by reference numeral 6. If the substrate is rotated along the axis of rotation 9 of the substrate concurrently with the rotation of the target, an area of a diameter of 16 cm can be uniformly deposited.

The pulse laser deposition method for a $YBa_2Cu_3O_{7-x}$ oxide (hereinafter, referred to as "YBCO thin film") high temperature superconductive thin film of a large area in accordance with an embodiment of the present invention will now be explained in detail. A target is shaped as a cylinder which is made of a powder of a composition as same as that of the YBCO thin film to be deposited. The target is sintered at a high temperature and pressure to become a sintered body having a sintering density corresponding to 95% of a theoretical density. The density of the target has a great deal of influences upon the formation of the surface of the thin film to be deposited. The surface of the prepared target is well polished by using a sand paper and is affixed to the target frame 2 by means of an adhesive. The target frame 2 is affixed to the target plate 1. Next, a substrate made of $LaAlO_3$ (100) of a diameter of 16 cm (hereinafter, referred to as "LAO") is fixed to a substrate heater.

After installing the target and substrate, the vacuum chamber 12 is closed. Within the vacuum chamber 12, a vacuum level of $1\times10^{-6}$ Torr is maintained, and the temperature is increased to 750° which is a temperature necessary to perform deposition. After reaching at this temperature, the pressure of oxygen within the chamber is maintained at 100 mTorr. The surface of the substrate is guarded by a substrate cover. Contaminants or particles affixed to the surface of the target are eliminated by using an eximer laser. Next, the target and substrate are rotated. After the substrate cover is eliminated, the eximer laser is made incident upon the target. The plume 5 rotates 360° along the axis of rotation 10 of the plume. The trajectory of the tip of the plume becomes a circle whose diameter corresponds to a radius of the substrate. Since the substrate rotates along the axis of rotation 8 of the substrate, the tip of the plume can be uniformly distributed at the front of the substrate 7.

As described above, if the laser deposition apparatus for a large area oxide thin film in accordance with the present invention is used, oxide thin films of a complex chemical composition can be uniformly deposited on a substrate of a diameter of 16 cm at a low cost. Particularly, when manufacturing a high frequency filter having a high temperature superconductive characteristics for use in a mobile communication, in which a large area thin film technology is important, a large area oxide thin film having a high temperature superconductive characteristic can be uniformly deposited at a low cost.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A laser deposition apparatus for depositing a large area oxide thin film on a substrate, comprising:

a tilted target affixed to a rotatable target plate by a target frame such that the target is tilted with respect to the target plate;

a substrate heater on which the substrate can be mounted and which can be rotated on its own axis; and an eximer laser installed within a vacuum chamber for irradiating a laser beam to said tilted target.

2. The laser deposition apparatus according to claim 1, wherein the vacuum chamber is at vacuum level of $1\times10^{-6}$ Torr, and connected to a gas supply system for supplying oxygen or argon therein to.

3. The laser deposition apparatus according to claim 1, wherein said tilted target is formed with a composition as same as an oxide thin film to be deposited.

4. The laser deposition apparatus according to claim 1, wherein said tilted target is a cylinder whose diameter is 2.5 cm, and is affixed to the surface of a target plate by a target frame such that said tilted target is tilted 45° with respect to the surface.

5. The laser deposition apparatus according to claim 1, wherein said tilted target can adjust a deposition area and rate by adjusting an angle of tilt to a predetermined angle.

6. The laser deposition apparatus according to claim 1, wherein said substrate is a $LaAlO_3$ (100) substrate whose diameter is 16 cm.

7. The laser deposition apparatus according to claim 1, wherein a thin film can be deposited on a substrate whose radius is equal to a diameter of a circular trajectory of the tip of a plume generated by a laser beam of an eximer laser by using a rotatable substrate heater.

* * * * *